United States Patent
Choi et al.

(10) Patent No.: US 9,355,669 B2
(45) Date of Patent: May 31, 2016

(54) PERPENDICULARLY MAGNETIZED THIN FILM STRUCTURE AND METHOD FOR MANUFACTURING THE SAME

(71) Applicant: KOREA INSTITUTE OF SCIENCE AND TECHNOLOGY, Seoul (KR)

(72) Inventors: Gyung Min Choi, Seoul (KR); Byoung Chul Min, Seoul (KR); Kyung Ho Shin, Seoul (KR)

(73) Assignee: KOREA INSTITUTE OF SCIENCE AND TECHNOLOGY, Seoul (KR)

( * ) Notice: Subject to any disclaimer, the term of this patent is extended or adjusted under 35 U.S.C. 154(b) by 123 days.

(21) Appl. No.: 13/678,856

(22) Filed: Nov. 16, 2012

(65) Prior Publication Data

US 2013/0130063 A1     May 23, 2013

(30) Foreign Application Priority Data

Nov. 18, 2011 (KR) .................... 10-2011-0120757

(51) Int. Cl.
| | |
|---|---|
| H01L 43/10 | (2006.01) |
| H01F 10/32 | (2006.01) |
| G11B 5/64 | (2006.01) |
| G11B 5/72 | (2006.01) |
| G11B 5/66 | (2006.01) |
| G11B 5/84 | (2006.01) |
| H01F 10/12 | (2006.01) |
| H01F 41/32 | (2006.01) |
| G11B 5/65 | (2006.01) |
| H01L 43/12 | (2006.01) |

(52) U.S. Cl.
CPC  *G11B 5/645* (2013.01); *G11B 5/65* (2013.01); *G11B 5/66* (2013.01); *G11B 5/72* (2013.01); *G11B 5/84* (2013.01); *H01F 10/123* (2013.01); *H01F 10/3286* (2013.01); *H01F 41/32* (2013.01); *H01F 10/3254* (2013.01); *H01L 43/10* (2013.01); *H01L 43/12* (2013.01)

(58) Field of Classification Search
USPC .................................... 427/128–131
See application file for complete search history.

(56) References Cited

U.S. PATENT DOCUMENTS

| | | | | |
|---|---|---|---|---|
| 6,709,767 | B2 * | 3/2004 | Lin ........................ | B82Y 10/00 148/277 |
| 7,663,197 | B2 * | 2/2010 | Nagase .................. | B82Y 25/00 257/421 |
| 9,087,543 | B2 * | 7/2015 | Hu ........................... | G11B 5/62 |

(Continued)

FOREIGN PATENT DOCUMENTS

| | | |
|---|---|---|
| EP | 2 287 863 A1 | 2/2011 |
| JP | 2007-035146 A | 2/2007 |

(Continued)

OTHER PUBLICATIONS http://www.merriam-webster.com/dictionary/several, May 2014.*

(Continued)

*Primary Examiner* — Kevin Bernatz
(74) *Attorney, Agent, or Firm* — Ladas & Parry LLP

(57) ABSTRACT

A perpendicularly magnetized thin film structure and a method of manufacturing the perpendicularly magnetized thin film structure are provided. The perpendicularly magnetized thin film structure includes i) a base layer, ii) a magnetic layer located on the base layer and having an $L1_0$-crystalline structure, and iii) a metal oxide layer located on the magnetic layer.

19 Claims, 13 Drawing Sheets

(56) References Cited

U.S. PATENT DOCUMENTS

| | | | |
|---|---|---|---|
| 9,123,887 B2* | 9/2015 | Lai | H01L 43/12 |
| 2003/0215675 A1 | 11/2003 | Inaba et al. | |
| 2007/0068797 A1* | 3/2007 | Jayasekara | 204/192.34 |
| 2007/0111332 A1* | 5/2007 | Zhao et al. | 438/3 |
| 2008/0088980 A1 | 4/2008 | Kitagawa et al. | |
| 2009/0079018 A1* | 3/2009 | Nagase | B82Y 25/00 257/421 |
| 2010/0177441 A1* | 7/2010 | Kanaya | G01R 33/098 360/234.3 |
| 2010/0214696 A1 | 8/2010 | Matsuzawa et al. | |
| 2012/0023386 A1* | 1/2012 | Oh et al. | 714/769 |
| 2012/0061781 A1* | 3/2012 | Ohmori | G11C 11/14 257/421 |
| 2012/0237796 A1* | 9/2012 | Koike | B82Y 10/00 428/811.2 |
| 2013/0069182 A1* | 3/2013 | Ohsawa | H01L 29/82 257/421 |

FOREIGN PATENT DOCUMENTS

| | | |
|---|---|---|
| JP | 2010-102757 A | 5/2010 |
| JP | 2010-232499 A | 10/2010 |

OTHER PUBLICATIONS

Gyung-Min Choi, et al; "$L1_0$ Ordering of FePtB Films on a Thin MgO Layer", Applied Physics Express, vol. 4, No. 2, Jan. 19, 2011, p. 023001, XP055054936; ISSN: 1882-0778, DOI: 10.1143/APEX.4. 023001.

C. Clavero, et al; "Control of the perpendicular magnetic anisotrophy of FePd films via Pd capping deposition", Applied Physics Letters, AIP, American Institute of Physics, Melville, NY, US, vol. 92, No. 16, Apr. 21, 2008, pp. 162502-1 to 162502-3, XP012106598, ISSN: 003-6951, DOI:10.1063/1.2916712.

Extended European Search Report; dated Aug. 3, 2013; Appln. No. 12192825.3-1353.

* cited by examiner

)# PERPENDICULARLY MAGNETIZED THIN FILM STRUCTURE AND METHOD FOR MANUFACTURING THE SAME

CROSS-REFERENCE TO RELATED APPLICATION

This application claims priority to and the benefit of Korean Patent Application No. 10-2011-0120757 filed in the Korean Intellectual Property Office on Nov. 18, 2011, the entire contents of which are incorporated herein by reference.

BACKGROUND OF THE INVENTION (a) Field of the Invention

The present invention relates to a perpendicularly magnetized thin film structure and a method of manufacturing the same. In more detail, the present invention relates to a perpendicularly magnetized thin film structure that can ensure perpendicular magnetic anisotropy while transforming a magnetic layer into $L1_0$-crystalline structure by oxidizing a metal layer on a magnetic layer by annealing a thin film structure including the magnetic layer and the metal layer, and a method of manufacturing the same.

(b) Description of the Related Art

Since a magnetic body having the $L1_0$-crystalline structure has high magnetic anisotropy, it is very useful as a material for information storage. In more detail, a magnetic body having the $L1_0$-crystalline structure may be used as a magnetic layer of storing information in a magnetic random access memory (MRAM) or a hard disk drive (HDD). Further, when a magnetic layer having large magnetic anisotropy is used, the magnetization direction of the magnetic layer is not changed by thermal agitation even if the volume of the magnetic layer is small, so that it is possible to highly integrate a memory device.

The material of a typical a magnetic body having the $L1_0$-crystalline structure may be FePt, FePd or CoPt. The c axis of the magnetic body having the $L1_0$-crystalline structure is an easy-magnetization axis and the magnetic body has perpendicular magnetic anisotropy when the c axis is perpendicularly arranged. In particular, it has been known that the perpendicular anisotropic energy of FePt alloy is large. When a magnetic body having high perpendicular magnetic anisotropy is used as a record layer, information loss due to thermal agitation does not occur even if the volume of the magnetic layer is very small, and a stability factor of the recording layer ($K_U V/k_B T$, $K_U$: magnetic anisotropy, V: volume of a magnetic body, $k_B$: Boltzmann constant, T: absolute temperature) becomes very high.

The above information disclosed in this Background section is only for enhancement of understanding of the background of the invention and therefore it may contain information that does not form the prior art that is already known in this country to a person of ordinary skill in the art.

SUMMARY OF THE INVENTION

The present invention has been made in an effort to provide a perpendicularly magnetized thin film structure having advantages capable of ensuring perpendicular magnetic anisotropy while transforming a magnetic layer into $L1_0$-crystalline structure by oxidizing a metal layer on a magnetic layer by annealing. Further, the present invention has been made in an effort to provide a method of manufacturing the perpendicularly magnetized thin film structure.

An exemplary embodiment of the present invention provides a perpendicularly magnetized thin film structure including: i) a base layer, ii) a magnetic layer located on the base layer and having an $L1_0$-crystalline structure, and iii) a metal oxide layer located on the magnetic layer.

The metal oxide layer may contain at least one of metal oxide selected from a group of $TiO_2$, $Ta_2O_5$, $Al_2O_3$, $Cr_2O_3$, $ZrO_2$, ZnO, $Cu_2O$, and NiO. The magnetic layer may contain a compound having a chemical formula of $A_{100-x}B_x$, the A may be at least one element selected from a group of Fe(iron), Co(cobalt), Ni(nickel), Mn(manganese) or Cr(chromium), the B may be at least one element selected from a group of Pt(platinum), Pd(palladium), Ni(nickel), Rh(rhodium), Au(gold), Hg(mercury) or Al(aluminum), and the x may be 25 at % to 75 at %. The x may be 40 at % to 60 at %. The magnetic layer may contain boron above 0 and under 50 at % and the metal oxide layer may contain $B_2O_3$.

The perpendicularly magnetized thin film structure according to an exemplary embodiment of the present invention may further include an insulating layer located between the base layer and the magnetic layer. The insulating layer may include an MgO layer and the thickness of the MgO layer may be 2 nm or less.

The base layer may include a magnetic layer. The magnetic layer may be made of at least one compound selected from a group of FePtB and CoPtB.

The perpendicularly magnetized thin film structure according to an exemplary embodiment of the present invention may further include another magnetic layer located between the insulating layer and the magnetic layer, having a BCC (Body Centered Cubic) crystalline structure, and containing at least one material selected from a group of CoFeB, CoFe and Fe. The perpendicularly magnetized thin film structure according to an exemplary embodiment of the present invention may further include an electrode layer located on the metal oxide layer and the thickness of the metal oxide layer may be smaller than the thickness of the magnetic layer.

Another exemplary embodiment of the present invention provides a method of manufacturing a perpendicularly magnetized thin film structure including: i) providing a base layer; ii) providing a magnetic layer on the base layer; iii) providing a metal layer on the magnetic layer; and iv) annealing the base layer, the magnetic layer, and the metal layer. During the annealing, the magnetic layer may be transformed to have an $L1_0$-crystalline structure, the c axis of the magnetic layer may be aligned perpendicular to the direction of the magnetic layer plane, and the metal layer may be transformed into a metal oxide layer.

The method according to an exemplary embodiment of the present invention may further include providing an insulating layer between the base layer and the magnetic layer. During the annealing, the insulating layer is annealed together with the base layer, the magnetic layer, and the metal layer. The method according to an exemplary embodiment of the present invention may further include providing another magnetic layer between the insulating layer and the metal layer, and during the annealing, the magnetic layer is annealed together with the base layer, the insulating layer, the magnetic layer, and the metal layer.

The annealing temperature during the annealing may be 400° C. to 900° C. Partial oxygen pressure during the annealing may be $10^{-10}$ bar to 1 bar.

The method according to an exemplary embodiment of the present invention may further include: i) reducing the thickness of the metal oxide layer after the annealing; and ii) providing an electrode layer on the metal oxide layer. The reducing of the thickness of the metal oxide layer may partially remove the metal oxide layer by performing argon ion milling, reactive ion etching, or chemical-mechanical planarization on the metal oxide layer.

It is possible to form a magnetic layer having an $L1_0$-crystalline structure even on an amorphous layer, using tensile stress of the metal layer located on the magnetic layer. Therefore, it is possible to manufacture a perpendicularly magnetized thin film structure having an $L1_0$-crystalline structure and excellent perpendicular magnetic anisotropy.

DETAILED DESCRIPTION OF THE EMBODIMENTS

Figure 1:
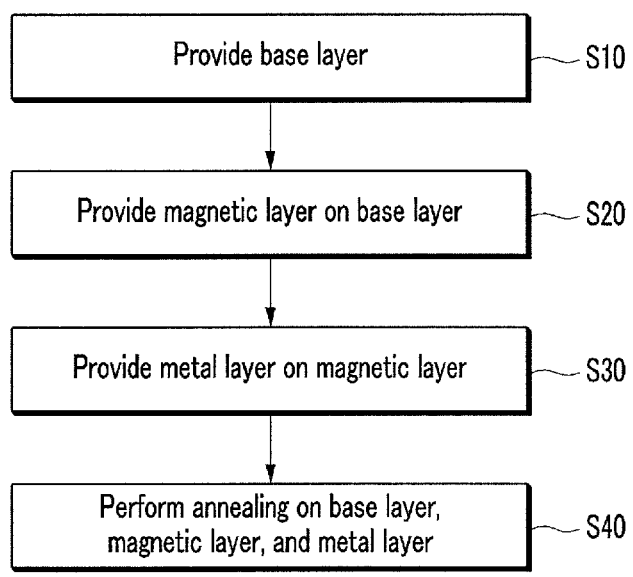
FIG. 1 is a flowchart schematically showing a process of manufacturing of a perpendicularly magnetized thin film structure.

It will be understood that when an element is referred to as being "on" another element, it can be directly on another element or intervening elements may be present therebetween. In contrast, when an element is referred to as being "directly on" another element, there are no intervening elements therebetween.

It will be understood that, although the terms first, second, third, etc. may be used herein to describe various elements, components, regions, layers, and/or sections, they are not limited thereto. These terms are only used to distinguish one element, component, region, layer, or section from another element, component, region, layer, or section. Thus, a first element, component, region, layer, or section discussed below could be termed a second element, component, region, layer, or section without departing from the teachings of the present invention.

Terminologies used herein are provided to merely mention specific exemplary embodiments and are not intended to limit the present invention. Singular expressions used herein include plurals unless they have definitely opposite meanings. The meaning of "including" used in this specification gives shape to specific characteristics, regions, positive numbers, steps, operations, elements, and/or components, and do not exclude the existence or addition of other specific characteristics, regions, positive numbers, steps, operations, elements, components, and/or groups.

Spatially relative terms, such as "below" and "above" and the like, may be used herein for ease of description to describe one element or feature's relationship to another element(s) or feature(s) as illustrated in the figures. It will be understood that spatially relative terms are intended to encompass different orientations of the device in use or operation in addition to the orientation depicted in the drawings. For example, if the device in the figures is turned over, elements described as "below" other elements or features would then be oriented "above" the other elements or features. Thus, the exemplary term "below" can encompass both an orientation of above and below. Apparatuses may be otherwise rotated 90 degrees or at other angles, and the spatially relative descriptors used herein are then interpreted accordingly.

All the terminologies including technical terms and scientific terms used herein have the same meanings that those skilled in the art generally understand. Terms defined in dictionaries are construed to have meanings corresponding to related technical documents and the present description, and they are not construed as ideal or very official meanings, if not defined.

Exemplary embodiments of the present invention described with reference to cross-sectional views represent ideal exemplary embodiments of the present invention in detail. Therefore, various modification of diagrams, for example, modifications of manufacturing methods and/or specifications, are expected. Accordingly, exemplary embodiments are not limited to specific shapes of shown regions, and for example, also include modifications of the shape by manufacturing. For example, regions shown or described as flat may generally have rough or rough and nonlinear characteristics. Further, parts shown to have sharp angles may be rounded. Therefore, the regions shown in the drawings are basically just schematic and the shapes thereof are not intended to show the exact shapes of the region and are also not intended to reduce the scope of the present invention.

The present invention will be described more fully hereinafter with reference to the accompanying drawings, in which exemplary embodiments of the invention are shown. As those skilled in the art would realize, the described embodiments may be modified in various different ways, all without departing from the spirit or scope of the present invention.

FIG. 1 shows a schematic cross-sectional structure of a perpendicularly magnetized thin film structure according to a first exemplary embodiment of the present invention and FIGS. 2 to 5 are diagrams schematically showing the steps of the process of manufacturing a perpendicularly magnetized thin film structure of FIG. 1. Hereinafter, a method of manufacturing a perpendicularly magnetized thin film structure will be described with reference to FIGS. 1 to 5. The method of manufacturing a perpendicularly magnetized thin film structure of FIG. 1 is an example of the present invention and the present invention is not limited thereto. Therefore, the method of manufacturing a perpendicularly magnetized thin film structure may be modified in other ways.

As shown in FIG. 1, a method of manufacturing a perpendicularly magnetized thin film structure includes i) providing a base layer (S10), ii) providing a magnetic layer on the base layer (S20), iii) providing a metal layer on the magnetic layer (S30), and iv) annealing the base layer, the magnetic layer, and the metal layer (S40). The method of manufacturing a perpendicularly magnetized thin film structure may further include other steps, if necessary.

Figure 2:
FIG. 2 to FIG. 5 are diagrams schematically showing the steps of the process of manufacturing a perpendicularly magnetized thin film structure of FIG. 1.
Figure 3:
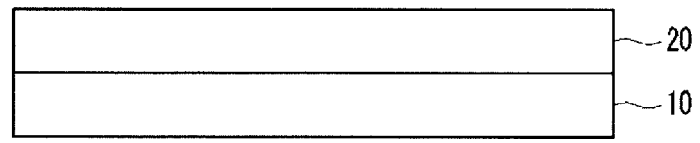

First, the step S10 of FIG. 1 provides a base layer 10. The base layer 10 may be formed by deposition in vacuum. The material or the crystalline structure of the base layer 10 of FIG. 2 is not specifically limited. Therefore, the material or the crystalline structure of the base layer 10 may be freely selected and used. The material of the base layer 10 may be silicon (Si) or gold (Au). An oxide such as MgO and a magnetic material such as CoFeB or FePtB may be used as the material of the base layer 10. The base layer 10 may be formed in a multi-layered structure by stacking the materials described above.

Next, the step S20 of FIG. 1 provides a magnetic layer 20 on the base layer 10. For example, the magnetic layer 20 may be formed on the base layer 10 by deposition inside vacuum. The magnetic layer 20 of FIG. 3 may contain a compound having a chemical formula of $A_{100-x}B_x$. The A may be Fe (iron), Co (cobalt), Ni (nickel), Mn (manganese) or Cr (chromium). Further, the B may be Pt (platinum), Pd (palladium), Ni (nickel), Rh (rhodium), Au (gold), Hg (mercury) or Al (aluminum). The element B is used as a symbol that includes various elements, not indicating boron.

Meanwhile, x may be 25 at % to 75 at %. More preferably, x may be 40 at % to 60 at %. When x is 50 at %, $L1_0$-structure is stable, but appropriate perpendicular magnetic anisotropy can be ensured within the above range. For example, when stress is applied from the periphery, it may be possible to ensure larger perpendicular magnetic anisotropy within the above range. However, when x is too small or too large, the structure of the compound may be chemically further stable, such that it cannot be called a $L1_0$-structure. Therefore, it is possible to ensure appropriate perpendicular magnetic anisotropy by adjusting the composition range of the compound contained in the magnetic layer 20 to the range described above. Meanwhile, the magnetic layer 20 may contain boron above 0 and not more than 50 at % to obtain an amorphous structure before being annealed.

The step S30 of FIG. 1 provides a metal layer 30 on the magnetic layer 20. The metal layer 30 of FIG. 4 may be formed on the magnetic layer 20 by depositing a material, such as titanium (Ti), tantalum (Ta), aluminum (Al), chromium (Cr), zirconium (Zr), zinc (Zn), copper (Cu), nickel (Ni) or boron, in vacuum. The amount of boron contained in the metal layer 30 may be above 0 and not more than 50 at %. When the amount of boron is too large, the metal layer 30 is difficult to be transformed into a metal oxide layer 32. Therefore, it is preferable to adjust the amount of boron into the range described above.

Figure 4:
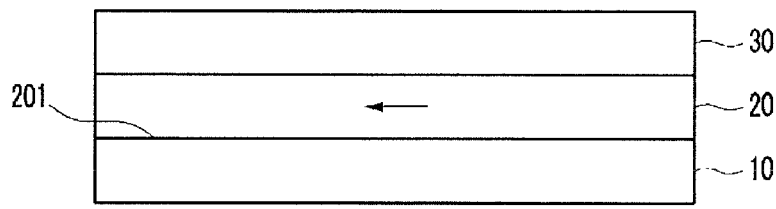

As indicated by an arrow in FIG. 4, the magnetic layer 20 has a magnetic easy direction in parallel with the direction in which a surface 201 of the magnetic layer 20 is extended. Before the annealing, due to the shape anisotropy, a magnetic easy axis is parallel to the direction in which the surface 201 is extended as shown in FIG. 4.

Returning to FIG. 1, the base layer 10, the magnetic layer 20, and the metal layer 30 are annealed in the step S40 of FIG. 1. The annealing temperature may be 400° C. to 900° C. When the annealing temperature is too low, the metal layer 30 is not oxidized well, such that sufficient tensile stress is not exerted to the magnetic layer 20 and it is difficult to ensure perpendicular magnetic anisotropy of the magnetic layer 20. By contrast, when the annealing temperature is too high, the magnetic layer 20, in addition to the metal layer 30, is oxidized by oxygen diffusion, such that it is difficult to change the crystalline structure of the magnetic layer 20 into the $L1_0$-structure. Therefore, it is preferable to adjust the annealing temperature into a range similar to the phase transformation temperature of the $L1_0$-crystalline structure.

In an exemplary embodiment of the present invention, perpendicular magnetic anisotropy is ensured by forming a magnetic layer having a $L1_0$-crystalline structure, using not the layer beneath the magnetic layer, but the layer on top of the magnetic layer. The layer on top of the magnetic layer was a metal layer before being annealed, but it is transformed into a metal oxide layer by annealing and applies tensile stress to an adjacent magnetic layer in parallel with the surface of the magnetic layer. For example, in the $L1_0$-crystalline structure of FePt, the lattice constant of a axis is 0.385 nm and the lattice constant of the c axis is 0.371 nm.

When a tensile stress is applied to the magnetic layer 20 in parallel with the surface 201 by an adjacent metal oxide layer 32 during annealing, the a axis having a relatively large lattice constant is aligned in parallel with the surface 201 of the magnetic layer 20 and the c axis having a relatively small lattice constant is aligned perpendicular to the surface 201 of the magnetic layer 20. When the magnetic layer 20 is annealed without tensile stress exerted in parallel with the surface 201 of the magnetic layer 20, the magnetic layer 20 becomes in an FCC polycrystalline structure or, even if the $L1_0$-crystalline structure is formed, the direction of the c axis may be distributed in both parallel and perpendicular to the direction in which the surface 201 of the magnetic layer 20 is extended, such that large perpendicular anisotropy cannot be obtained. Therefore, the tensile stress applied to the magnetic layer 20 in parallel with the surface 201 of the magnetic layer 20 during annealing helps the magnetic layer 20 form the $L1_0$-crystalline structure and the c axis be arranged perpendicular to the surface 201 of the magnetic layer 20. In particular, since tensile stress is applied not to the lower part, but the upper part of the magnetic layer 20, it is possible to form the $L1_0$-crystalline structure in the magnetic layer 20 even though the base layer 10 located under the magnetic layer 20 has not a crystalline structure, but an amorphous structure.

Figure 5:
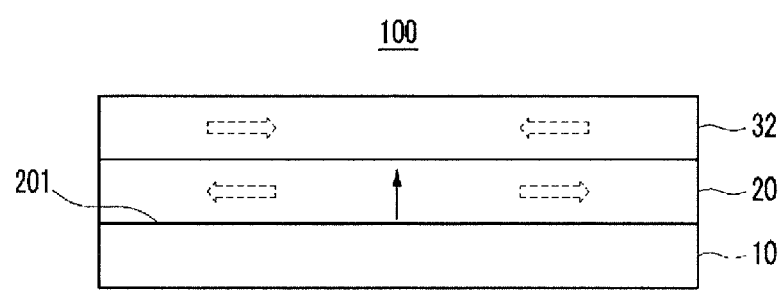

The metal layer 30 of FIG. 4 is transformed into a metal oxide layer 32 of FIG. 5 by annealing. When the metal layer 30 is exposed to atmospheric pressure by annealing, the surface of the metal layer 30 is oxidized by reacting with the oxygen in the atmosphere. Only the surface of the metal layer 30 is oxidized and the part adjacent to the magnetic layer 20 remains in the metal state without being oxidized at room temperature because the oxidation reaction speed is small.

As shown in FIG. 5, the metal layer 30 (shown in FIG. 4, the same below) is transformed into the metal oxide layer 32 and the volume increases while being oxidized by annealing. Table 1 shows examples of volume expansion ratios of metals.

TABLE 1

| Metal | Ti | Ta | Al | Cr | Zr | Zn | Cu | Ni |
|---|---|---|---|---|---|---|---|---|
| Volume expansion ratio | 1.73 | 2.47 | 1.28 | 2.07 | 1.56 | 1.58 | 1.64 | 1.65 |

The volume expansion ratio in which the metal layer 30 is transformed into a metal oxide layer 32 is defined as the ratio of the volume of the metal oxide layer 32 to the volume of the metal layer 30. As shown in Table 1, the volume expansion ratios of the metals are greater than 1, such that the metal layer 30 applies tensile stress to an adjacent magnetic layer 20 while transforming into the metal oxide layer 32. The tensile stress may be in associated with the formation of an $L1_0$-structure. When annealing is performed at temperature similar to the phase transformation temperature of the $L1_0$-crystalline structure in consideration of the phase transformation temperature of 600° C. to 700° C., the crystalline structure of the magnetic layer 20 is transformed into $L1_0$. Meanwhile, the c axis of the magnetic layer 20 having the $L1_0$-crystalline structure by the applied tensile stress is aligned perpendicular to the direction in which the surface 201 of the magnetic layer 20 is extended. That is, as indicated by a dotted arrow in FIG. 5, when stress is exerted in the direction in which the surface 201 of the magnetic layer 20 is extended, it is stable in terms of energy when the c axis having a lattice constant relatively smaller than that of the a axis aligned perpendicular to the surface 201 of the magnetic layer 20.

As shown in FIG. 5, when the metal layer 30 increases in volume in the direction in which the surface 201 of the magnetic layer 20 is extended while being oxidized during the annealing, the planar length does not match to that of the adjacent magnetic layer 20. Therefore, the length of the metal layer 30 increases in the direction in which the surface 201 of the magnetic layer 20 is extended, such that compressive stress is applied to the metal layer 30 of FIG. 5 and tensile stress is applied to the magnetic layer 20.

It is preferable that tensile stress of about several GPa is applied to the magnetic layer 20 in the direction in which the surface 201 of the magnetic layer 20 is extended, in order to align the c axis of the $L1_0$-crystalline structure to be perpendicular to the direction in which the surface 201 of the magnetic layer 20 is extended. The magnitude of the tension is changed in accordance with the kinds of the material of the metal layer 30, the thickness of the metal layer 30, the annealing temperature, the annealing time, and the degree of vacuum. Therefore, it is possible to apply ideal tensile stress to the magnetic layer 20 by adjusting the degree of formation of the metal oxide layer 32.

Meanwhile, when the magnetic layer 20 is annealed like above, appropriate temperature and an appropriate degree of vacuum depends on the thickness of the metal layer 30 and the standard free energy of formation of oxides. The annealing may be performed under various degrees of vacuum from a high vacuum to atmospheric pressure. The standard free energy of formation $\Delta G^0$ of oxidation reaction can be expressed by the following Chemical Formula 1. In Chemical Formula 1, $\Delta H^0$ is standard formation heat, $\Delta S^0$ is a change in standard entropy, and T is absolute temperature.

$$\Delta G^0 = \Delta H^0 - T\Delta S^0 \qquad \text{[Chemical Formula 1]}$$

When the standard free energy of formation $\Delta G^0$ of oxidation reaction is a negative value, this means that oxidation reaction spontaneously occurs. The following Table 2 shows standard free energy of formation of oxide of Ti, Ta, Al, Cr, Zr, Zn, Cu and Ni at partial oxygen pressure of 1 bar and annealing temperature of 700° C.

TABLE 2

| Metal oxide | $TiO_2$ | $Ta_2O_5$ | $Al_2O_3$ | $Cr_2O_3$ | $ZrO_2$ | Zno | $Cu_2O$ | NiO |
|---|---|---|---|---|---|---|---|---|
| Standard free energy of formation of oxide (kJ/mol) | −760 | −650 | −910 | −570 | −910 | −500 | −190 | −300 |

As shown in Table 2, since the energy of formation of all the oxides have negative values, the metal layer 30 generated oxide formation reaction at partial oxygen pressure of 1 bar and annealing temperature of 700° C. Since the absolute value of the oxide formation energy is large, the oxide formation reaction is generated even if the partial oxygen pressure is very smaller than 1 bar. The free energy of formation when the partial oxygen pressure is not 1 bar can be expressed by the following Chemical Formula 2. R is an ideal gas constant and $P_{O2}$ is partial oxygen pressure.

$$\Delta G = \Delta G^0 - RT \ln P_{O2} \qquad \text{[Chemical Formula 2]}$$

$Cu_2O$ has the smallest negative $\Delta G^0$ among the metal oxides. When the metal oxide is $Cu_2O$, the partial oxygen pressure where $\Delta G$ is zero, that is, the oxidation reaction stops is $10^{-10}$ bar. Since the other oxides have very large absolute values of $\Delta G^0$, the partial oxygen pressure where the oxidation reaction stops is far smaller than $10^{-10}$ bar. Therefore, when a thin film structure is annealed at a partial oxygen pressure of $10^{-10}$ bar to 1 bar, the metal layer 30 is oxidized into the metal oxide layer 32. In contrast, when the degree of vacuum is too small or too large, the metal layer 30 may not be transformed into the metal oxide layer 32.

Meanwhile, an appropriate degree of vacuum within the degree of vacuum described above is changed in accordance with the material of the metal layer 30, the thickness of the metal layer 30, the annealing temperature, and the annealing time. For example, when oxygen ion conductivity of the metal oxide layer 32 is high, the thickness of the metal layer 30 is small, the annealing temperature is high, or the annealing time is long, an excellent degree of vacuum, that is, low partial oxygen pressure is required. In this case, when the partial oxygen pressure is too high, even the magnetic layer 20 is oxidized, which may interferes with formation of $L1_0$-crystalline structure of the magnetic layer 20.

The metal oxide layer 32 shown in FIG. 5 may contain $TiO_2$, $Ta_2O_5$, $Al_2O_3$, $Cr_2O_3$, $ZrO_2$, ZnO, $Cu_2O$, NiO or $B_2O_3$. In more detail, when B is used to form the metal layer 30 in an amorphous structure, the metal oxide layer 32 may contain $B_2O_3$.

As shown in FIG. 5, the c axis of the annealed magnetic layer 20 has an $L1_0$-crystalline structure perpendicular to the direction in which the surface 201 of the magnetic layer 20 is extended. Further, in the $L1_0$-crystalline structure, the c axis of the magnetic layer 20 is aligned perpendicular to the direction in which the surface 201 of the magnetic layer 20 is extended. As a result, as is indicated by a solid arrow in FIG. 5, the magnetic each direction is also perpendicular to the direction in which the surface 201 of the magnetic layer 20 is extended. Therefore, the annealed magnetic layer 20 has perpendicular magnetic anisotropy.

Figure 6:
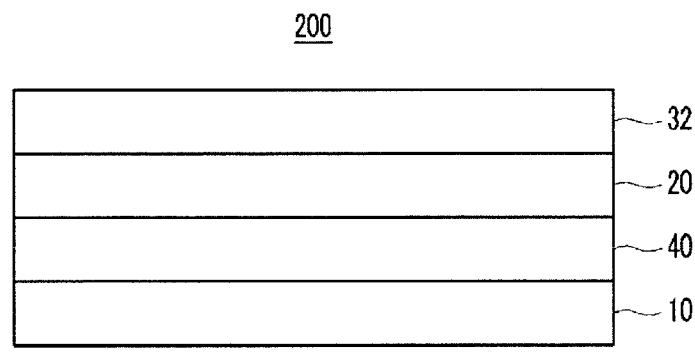
FIGS. 6 to 8 are schematic cross-sectional views of perpendicularly magnetized thin film structures according to second to fifth exemplary embodiments of the present invention.

FIG. 6 schematically shows a cross-sectional structure of a perpendicularly magnetized thin film structure 200 according to a second exemplary embodiment of the present invention. The cross-sectional structure of the perpendicularly magnetized thin film structure 200 of FIG. 6 is an example of the present invention and the present invention is not limited thereto. Therefore, the cross-sectional structure of the perpendicularly magnetized thin film structure 200 can be modified in various ways. Further, the structure of the perpendicularly magnetized thin film structure 200 of FIG. 6 is similar to the structure of the perpendicularly magnetized thin film structure 100 of FIG. 5, except for an insulating layer 40, such that like reference numerals refer to like components and the detailed description is omitted.

As shown in FIG. 6, the insulating layer 40 is located between the base layer 10 and the magnetic layer 20. The insulating layer 40 may be formed on the base layer 10 by deposition and the magnetic layer 20 may be formed on the insulating layer 40 by deposition. The insulating layer 40, the base layer 10, the magnetic layer 20, and the metal layer are annealed together. (not shown) Since the base layer 10 and the magnetic layer 20 are insulated by the insulating layer 40, a damage due to electric conduction can be prevented. Meanwhile, though not shown in FIG. 6, the insulating layer 40 may include an MgO layer and the thickness of the MgO layer may be 2 nm or less. When the thickness of the MgO layer is too large, the manufacturing cost of the perpendicularly magnetized thin film structure 200 may considerably increase. Therefore, the thickness of the MgO layer is adjusted to the range described above.

Figure 7:
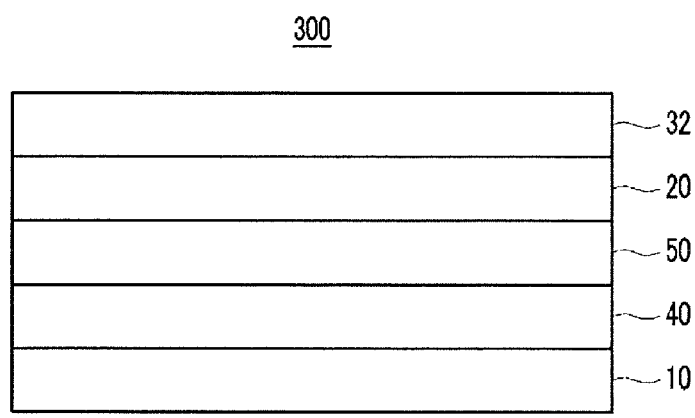

FIG. 7 schematically shows a cross-sectional structure of a perpendicularly magnetized thin film structure 300 according to a third exemplary embodiment of the present invention. The cross-sectional structure of the perpendicularly magnetized thin film structure 300 of FIG. 7 is an example of the present invention and the present invention is not limited thereto. Therefore, the cross-sectional structure of the perpendicularly magnetized thin film structure 300 can be modified in various ways. Further, the structure of the perpendicularly magnetized thin film structure 300 of FIG. 7 is similar to the structure of the perpendicularly magnetized thin film structure 200 of FIG. 6, except for another magnetic layer 50, such that like reference numerals refer to like components and the detailed description is omitted.

As shown in FIG. 7, another magnetic layer 50 is located between the insulating layer 40 and the magnetic layer 20. The magnetic layer 50 may be formed on the insulating layer 40 by deposition and the magnetic layer 20 may be formed on the magnetic layer 50 by deposition. The magnetic layer 50 is annealed with the base layer 10, the insulating layer 40, the magnetic layer 20, and the metal layer. (not shown)

CoFeB, CoFe, or Fe may be used as the material of the magnetic layer 50. The magnetic layer 50 has a BCC (body centered cubic) crystalline structure by the materials. When the insulating layer 40 made of MgO and the is magnetic body 50 having a BCC crystalline structure are adjacent to each other, a magnetic read signal value is large, such that it is possible to greatly increase a read signal.

Figure 8:
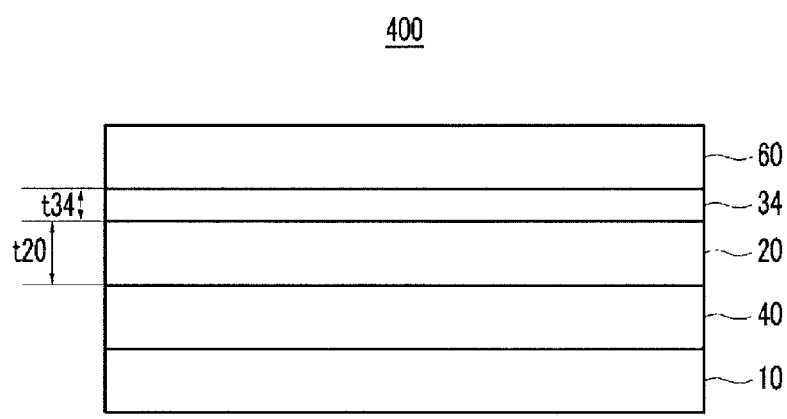

FIG. 8 schematically shows a cross-sectional structure of a perpendicularly magnetized thin film structure 400 according to a fourth exemplary embodiment of the present invention. The cross-sectional structure of the perpendicularly magnetized thin film structure 400 of FIG. 8 is an example of the present invention and the present invention is not limited thereto. Therefore, the cross-sectional structure of the perpendicularly magnetized thin film structure 400 can be modified in various ways. Further, the structure of the perpendicularly magnetized thin film structure 400 of FIG. 8 is similar to the structure of the perpendicularly magnetized thin film structure 200 of FIG. 6, except for a metal oxide layer 34 and an electrode layer 60, such that like reference numerals refer to like components and the detailed description is omitted.

As shown in FIG. 8, the electrode layer 60 is located on the metal oxide layer 34. The electrode layer 60 may be formed on the metal oxide layer 34 by deposition. When the resistance of the metal oxide layer 34 that has been transformed by annealing is larger than the resistance of the insulating layer 40 made of MgO, the read signal value generated from the perpendicularly magnetized thin film structure becomes small. It is preferable that the resistance of the metal oxide layer 34 is smaller than the resistance of the insulating layer 40 in order to improve the read signal value.

Therefore, as shown in FIG. 8, it is possible to reduce the thickness of the metal oxide layer 34 after annealing. That is, when the thickness of the metal layer is reduced before being transformed to the metal oxide layer 34, before annealing, it may interfere with formation of the $L1_0$-crystalline structure of the magnetic layer 20. Therefore, it is preferable to reduce the thickness t34 of the metal oxide layer 34 not before annealing, but after annealing. That is, it is possible to partially remove the metal oxide layer 34 by performing argon ion milling, reactive ion etching, or chemical-mechanical planarization on the metal oxide layer 34. In this case, the thickness t34 of the metal oxide layer 34 becomes smaller than the thickness t20 of the magnetic layer 20. It is possible to provide an electrode layer 60 with small resistance onto the metal oxide layer 34 after reducing the thickness t34 of the metal oxide layer 34. The electrode layer 60 may be deposited on the metal oxide layer 34 and the perpendicularly magnetized thin film structure 400 is electrically connected with an external power source.

Unlike the first exemplary embodiment of the present invention to the fourth exemplary embodiment, the methods generally known in the art to obtain an $L1_0$-crystalline structure from a metal alloy are as follows. First, a base layer that is grown in a (001) direction is formed and an alloy having an $L1_0$-crystalline structure is manufactured by epitaxial growth on the base layer. For example, a base layer having a thickness of several nm is grown along the (001) direction on a MgO monocrystalline substrate grown in the (001) direction or a Si substrate, and then an $L1_0$ alloy is formed thereon. Many problems are caused when the base layer is used in the method described above. First, the price of the monocrystalline substrate made of MgO is higher than the price of the substrate made of Si. Further, it is difficult to form the base layer. In general, the deposition temperature should be high to grow the base layer in the (001) direction on the Si substrate, but as the deposition temperature increases, process equipment is required and the process variables to be controlled increases. Further, the use of an alloy having an $L1_0$-crystalline structure is limited by the base layer. Even if the base layer does not have a (001) crystalline structure, it is possible to use various alloy having an $L1_0$-crystalline structure, if it is possible to form an $L1_0$-crystalline structure on the base layer.

Hereinafter, the present invention will be described in more detail with reference to Experimental Examples. The Experimental Examples are only examples of the present invention and the present invention is not limited thereto.

Experimental Example 1

A thermally-oxidized silicon substrate was prepared. An MgO layer having a thickness of 2 nm was deposited on the silicon substrate by a sputter system. Further, a magnetic layer having a thickness of 10 nm and containing a compound having a chemical formula of $Fe_{40}Pt_{40}B_{20}$ in atomic % was deposited on the MgO layer. Further, a thin film structure was manufactured by depositing a titanium layer having a thickness of 5 nm on the magnetic layer. The thin film structure is annealed by the method described above, under the degree of vacuum of $10^{-9}$ bar to $10^{-8}$ bar, at temperature of 600° C., for 30 minutes. The silicon substrate and the MgO layer correspond to the base structure.

Experimental Example 2

A thermally-oxidized silicon substrate was prepared. An MgO layer having a thickness of 2 nm was deposited on the silicon substrate by a sputter system. Further, a lower magnetic layer having a thickness of 1 nm and containing a compound having a chemical formula of $Co_{40}Pt_{40}B_{20}$ in atomic % was deposited on the MgO layer. Further, an upper magnetic layer having a thickness of 10 nm and containing a compound having a chemical formula of $Fe_{40}Pt_{40}B_{20}$ was deposited on the lower magnetic layer. Further, a thin film structure was manufactured by depositing a titanium layer having a thickness of 5 nm on the upper magnetic layer. The thin film structure manufactured by the method described above, is annealed under the degree of vacuum of $10^{-9}$ bar to $10^{-8}$ bar, at temperature of 600° C., for 30 minutes. The silicon substrate, the MgO layer, and the lower magnetic layer correspond to the base structure.

Experimental Example 3

A magnetic layer having a thickness of 2 nm and containing a compound having a chemical formula of $Co_{40}Pt_{40}B_{20}$ in atomic % was deposited on the MgO layer. The other experimental conditions were the same as those in Experimental Example 2.

Experimental Example 4

A buffer layer made of Au was prepared. A lower magnetic layer having a thickness of 10 nm and containing a compound having a chemical formula of $Fe_{40}Pt_{40}B_{20}$ in atomic % was deposited on the buffer layer by a sputter system. Further, an MgO layer having a thickness of 2 nm was deposited on the magnetic layer. Further, an upper magnetic layer having a thickness of 3 nm and containing a compound having a chemical formula of $Fe_{40}Pt_{40}B_{20}$ in atomic % was deposited on the MgO layer. Further, a thin film structure was manufactured by depositing a titanium layer having a thickness of 5 nm on the upper magnetic layer. The thin film structure is annealed by the method described above, under the degree of vacuum of $10^{-9}$ bar to $10^{-8}$ bar, at temperature of 700° C., for 30 minutes. The buffer layer, the lower magnetic layer, and the MgO layer correspond to the base structure.

Comparative Example 1

A thermally-oxidized silicon substrate was prepared. An MgO layer having a thickness of 2 nm was deposited on the silicon substrate by a sputter system. Further, a magnetic layer having a thickness of 10 nm and containing a compound having a chemical formula of $Fe_{40}Pt_{40}B_{20}$ in atomic % was deposited on the MgO layer. Further, a thin film structure was manufactured by depositing a titanium layer having a thickness of 5 nm on the magnetic layer. The thin film structure is not annealed.

Results of Experimental and Comparative Examples
Component Analysis Result of Thin Film Structure
Components of thin film structures were analyzed by an auger electron spectroscope. That is, the components of the thin film structured manufactured in accordance with Experimental Example 1 and Comparative Example 1 were analyzed by an auger electron spectroscope.

Figure 9:
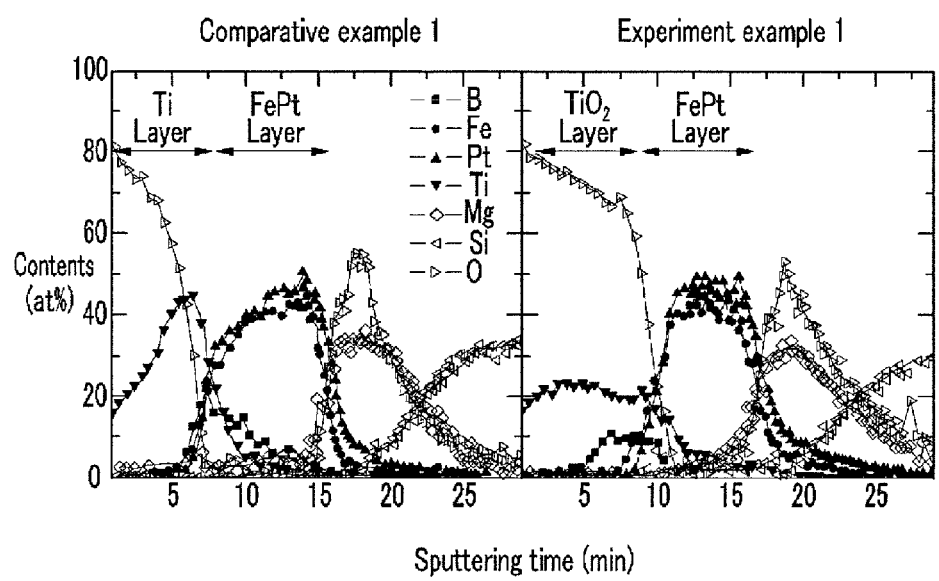
FIG. 9 is a depth profile of composition of thin film structure manufactured in accordance with Experimental Example 1 and Comparative Example 1, using auger electron spectroscopy.

FIG. 9 shows the result of analyzing the components of thin film structures manufactured by Experimental Example 1 and Comparative Example 1 by using auger electron microscope. The components of a thin film structure manufactured in accordance with Comparative Example 1 is shown at the left in FIG. 9 and a thin film structure manufactured in accordance with Experimental Example 1 is shown at the right of FIG. 9.

As shown at the right of FIG. 9, a graph corresponding to a titanium oxide ($TiO_2$) layer and an FePt layer was shown in Experimental Example 1. That is, it can be seen that oxidation expands to the entire titanium layer by annealing the thin film structure. However, the oxide was formed only on the titanium layer and could not expand to the FePtB layer, which is a magnetic layer. This is because the annealing was performed under sufficiently high degree of vacuum, that is, low partial oxygen pressure. It was possible to prevent oxidation to the FePtB layer because the thickness of the titanium layer was optimized to 5 nm in Experimental Example 1. When a layer made of another material, not the titanium layer, is used under the same vacuum and annealing conditions, the thickness for oxidizing only the layer may become different.

By contrast, a graph corresponding to the titanium layer and the FePt layer was shown in Comparative Example 1, as shown at the left in FIG. 9. That is, only the surface of the titanium layer positioned at the upper part of the thin film structure was exposed to room temperature and oxidized before annealing the thin film structure, and the parts adjacent to the FePtB magnetic layer was not oxidized and remained as the titanium layer.

X-Ray Diffraction Analysis Result
The crystalline structure of a thin film structure was analyzed by an X-ray diffractometry. That is, the crystalline structure of the thin film structured manufactured in accordance with Experimental Example 1 and Comparative Example 1 was analyzed by an X-ray diffractometry.

Figure 10:
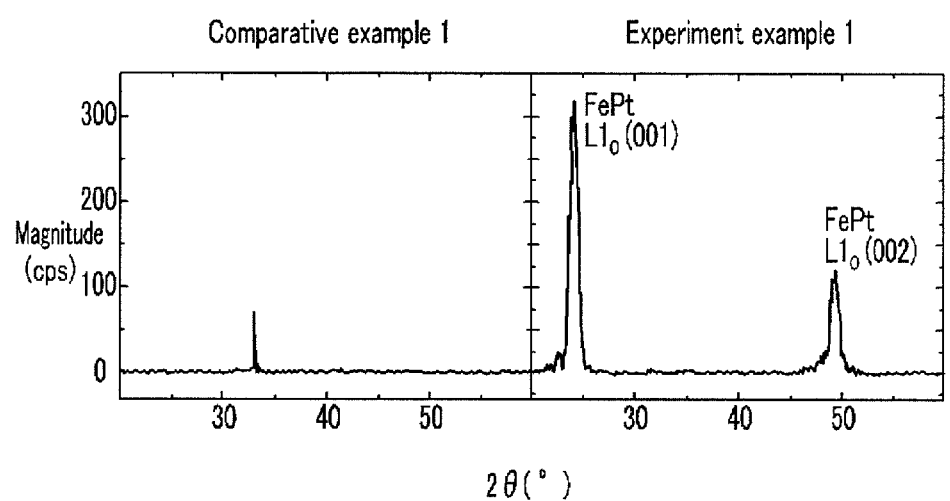
FIG. 10 is an analysis graph of a crystalline structure of a thin film structure manufactured in accordance with Experimental Example 1 and Comparative Example 1, using an X-ray diffractometry.

FIG. 10 is a graph analyzing the crystalline structure of a thin film structure manufactured in accordance with Experimental Example 1 and Comparative Example 1, using an X-ray diffractometry. The result of analyzing the crystalline structure of a thin film structure manufactured in accordance with Comparative Example 1 is shown at the left in FIG. 10 and the result of analyzing the crystalline structure of a thin film structure manufactured in accordance with Experimental Example 1 is shown at the right of FIG. 10.

As shown at the right in FIG. 10, (001) diffraction and (002) diffraction of a $L1_0$-crystalline structure were shown at 24° and 49°, in Experimental Example 1, as the result of X-ray diffraction experiment. Therefore, it was possible to see that the magnetic layer was transformed to have an $L1_0$-crystalline structure.

By contrast, as shown at the left in FIG. 10, it was possible to see that the magnetic layer did not have any crystalline structure, that is, had an amorphous structure, because there was no peak in Comparative Example 1.

Magnetic Characteristic Change Test Result
Magnetic characteristics of a thin film structure were analyzed by using a vibrating sample magnetometer. That is, the magnetic characteristics of a thin film structure manufactured in accordance with Experimental Example 1 to Experimental Example 3 and Comparative Example 1 were analyzed by using a vibrating sample magnetometer.

Figure 11:
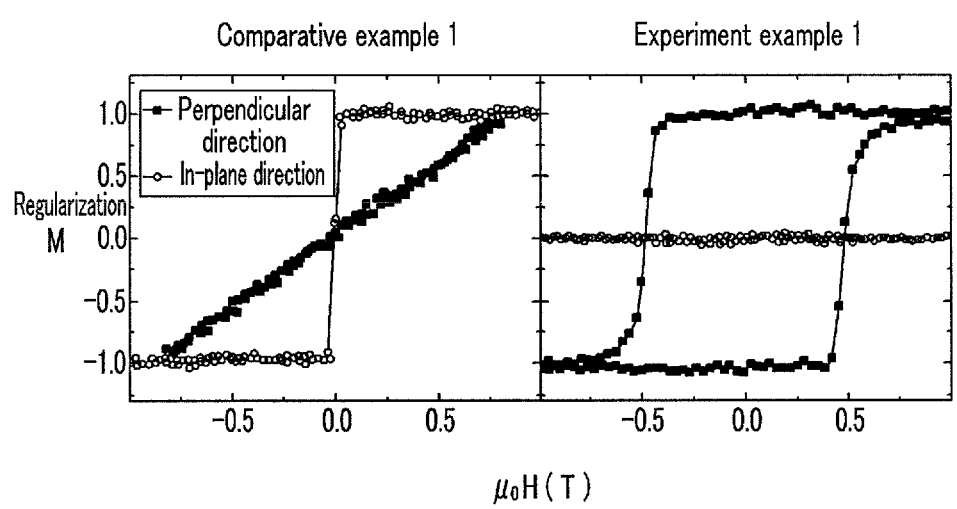
FIG. 11 is a magnetic hysteresis curve of a thin film structure manufactured in accordance with Experimental Example 1 and Comparative Example 1 using a vibrating sample magnetometer (VSM).

FIG. 11 is a magnetic hysteresis curve of a thin film structure manufactured in accordance with Experimental Example 1 and Comparative Example 1 using a vibrating sample magnetometer. A magnetic hysteresis curve of a thin film structure manufactured in accordance with Comparative Example 1 is shown at the left in FIG. 11 and a magnetic hysteresis curve of a thin film structure manufactured in accordance with Experimental Example 1 is shown at the right of FIG. 11.

As shown at the right of FIG. 11, the magnetic easy direction of the magnetic layer was changed to be perpendicular to the film plane in the thin film structure manufactured in accordance with Experimental Example 1. Therefore, it was possible to see that the magnetic layer has a perpendicular magnetic anisotropy. That is, it was possible to see that the magnetic layer had and $L1_0$-crystalline structure and the c axis was aligned perpendicular to the film plane of the magnetic layer. On the contrary, as shown at the left in FIG. 11, it was possible to see that the magnetic easy direction of the magnetic body was aligned in the direction of the film plane of the magnetic layer in the thin film structure manufactured in accordance with Comparative Example 1.

Figure 12:
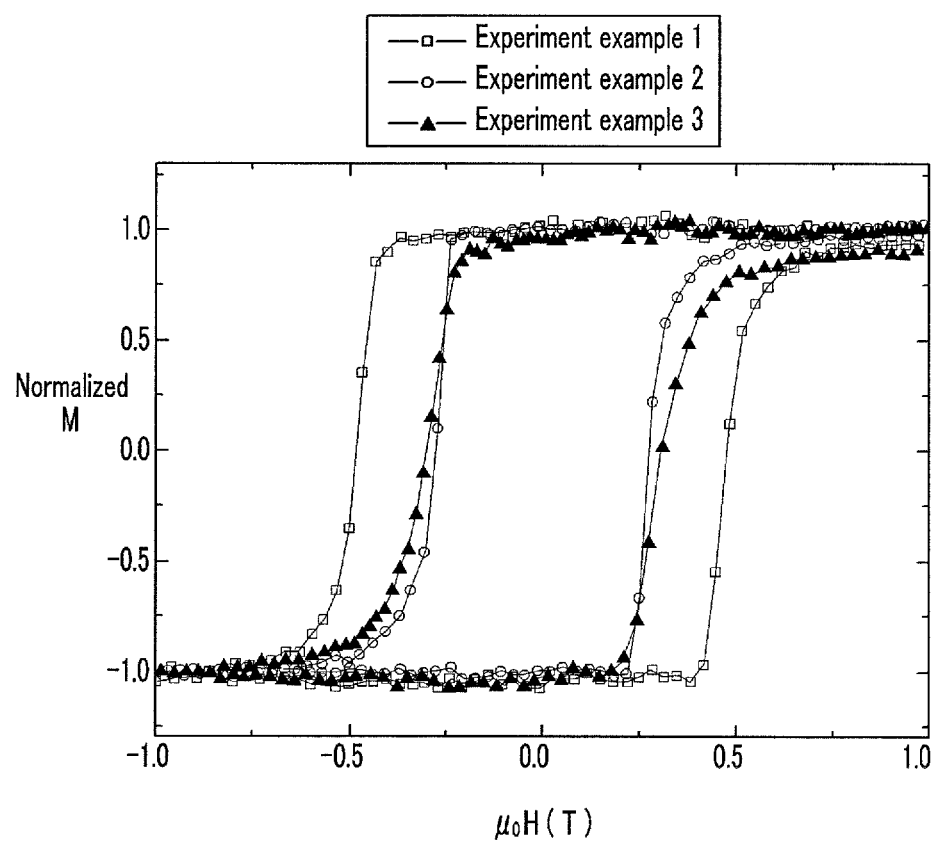
FIG. 12 is a magnetic hysteresis curve of a thin film structure manufactured in accordance with Experimental Example 1 to Experimental Example 3, using a vibrating sample magnetometer.

FIG. 12 shows magnetic hysteresis curves of thin film structures manufactured in accordance with Experimental Example 1 to Experimental Example 3, using a vibrating sample magnetometer. In FIG. 12, the rectangle indicates Experimental Example 1, the circle indicates Experimental Example 2, and the triangle indicates Experimental Example 3.

As shown in FIG. 12, it was possible to form an $L1_0$-crystalline structure on an upper magnetic layer even using a lower magnetic layer having an amorphous structure containing a compound having a chemical formula of $Co_{40}Pt_{40}B_{20}$ for the thin film structures in Experimental Examples 2 and 3. That is, even though there is the lower magnetic layer, it was possible to form the $L1_0$-crystalline structure on the upper magnetic layer by tensile force due to the oxidation of a titanium layer during the annealing. Therefore, it was possible to transform the magnetic layer to have an $L1_0$-crystalline structure while reducing dependency of the base structure on crystallinity.

Figure 13:
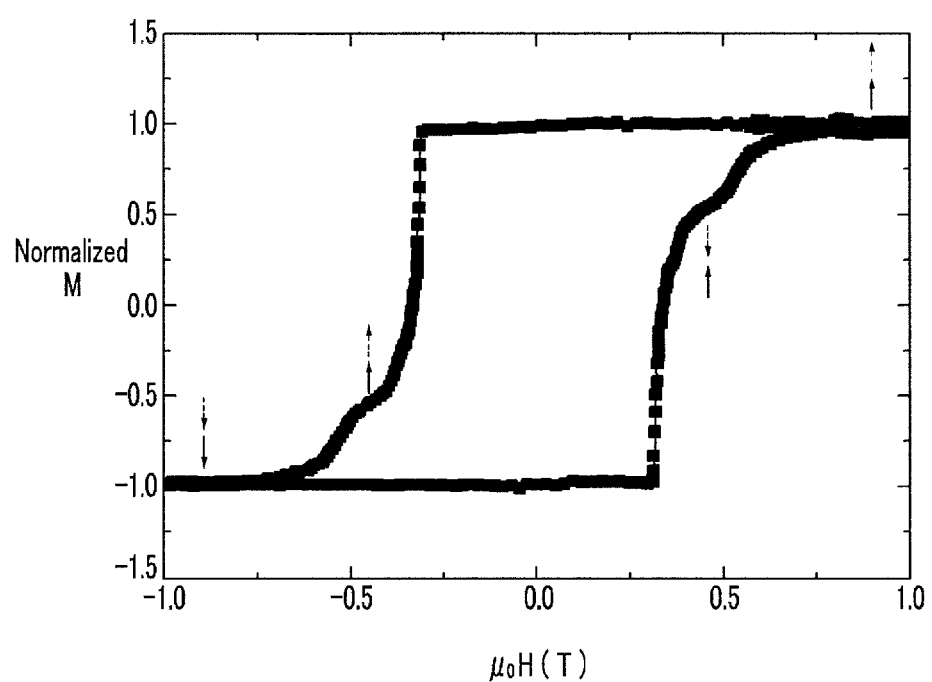
FIG. 13 is a magnetic hysteresis curve of a thin film structure manufactured in accordance with Experimental Example 4, using a vibrating sample magnetometer.

FIG. 13 is a magnetic hysteresis curve of a thin film structure manufactured in accordance with Experimental Example 4, using a vibrating sample magnetometer. In FIG. 13, the part indicated by a dotted line shows the magnetization direction of the upper magnetic layer and the part indicated by a solid line indicates the magnetization direction of the lower magnetic layer.

The upper magnetic layer was made have an $L1_0$-crystalline structure by annealing in Experimental Example 4. Further, the titanium layer is oxidized into a titanium oxide layer.

As shown in FIG. 13, the coercive force of the lower magnetic layer was measured as about 0.3 T and the coercive force of the upper magnetic layer was measured as about 0.5 T. Therefore, it was possible to make the magnetization directions of the upper magnetic layer and the lower magnetic layer parallel or anti-parallel, by applying an appropriately external magnetic field. The resistance depends on whether the magnetization directions of the upper magnetic layer and the lower magnetic layer facing each other with the MgO layer therebetween is parallel or anti-parallel. That is, information is recorded in the direction of the magnetic layer and information is regenerated by reading a resistance difference in a magnetic tunnel junction device.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A perpendicularly magnetized thin film structure comprising:
    a base layer;
    a magnetic layer located on the base layer and having an $L1_0$-crystalline structure; and
    a metal layer located on the magnetic layer, wherein only a surface of the metal layer is oxidized into a metal oxide layer and a part of the metal layer adjacent to the magnetic layer remains in a metal state without being oxidized, and wherein the metal oxide layer contains at least one metal oxide selected from a group of $Cr_2O_3$, $ZrO_2$, $ZnO$, $Cu_2O$, and $NiO$,
    wherein the magnetic layer contains boron above 0 and not more than 50 at % and the metal oxide layer contains $B_2O_3$.

2. The perpendicularly magnetized thin film structure of claim 1, wherein the metal oxide layer further contains at least one of metal oxide selected from a group of $TiO_2$, $Ta_2O_5$, and $Al_2O_3$.

3. The perpendicularly magnetized thin film structure of claim 1, wherein the magnetic layer contains a compound having a chemical formula of $A_{100-x}B_x$, the A is at least one element selected from a group of Fe(iron), Co(cobalt), Ni(nickel), Mn(manganese) or Cr(chromium), the B is at least one element selected from a group of Pt(platinum), Pd(palladium), Ni(nickel), Rh(rhodium), Au(gold), Hg(mercury) or Al(aluminum), and the x is 25 at % to 75 at %.

4. The perpendicularly magnetized thin film structure of claim 3, wherein the x is 40 at % to 60 at %.

5. The perpendicularly magnetized thin film structure of claim 1, further comprising an insulating layer located between the base layer and the magnetic layer.

6. The perpendicularly magnetized thin film structure of claim 5, wherein the insulating layer includes an MgO layer and the thickness of the MgO layer is 2 nm or less.

7. The perpendicularly magnetized thin film structure of claim 5, wherein the base layer includes a magnetic layer.

8. The perpendicularly magnetized thin film structure of claim 7, wherein the magnetic layer of the base layer is made of at least one compound selected from a group of FePtB and CoPtB.

9. The perpendicularly magnetized thin film structure of claim 5, further comprising another magnetic layer located between the insulating layer and the magnetic layer, having a BCC (Body Centered Cubic) crystalline structure, and containing at least one material selected from a group of CoFeB, CoFe and Fe.

10. The perpendicularly magnetized thin film structure of claim 5, further comprising an electrode layer located on the metal oxide layer and the thickness of the metal oxide layer s smaller than the thickness of the magnetic layer.

11. A method of manufacturing a perpendicularly magnetized thin film structure, comprising:
    providing a base layer;
    providing a magnetic layer on the base layer;
    providing a metal layer on the magnetic layer; and
    annealing the base layer, the magnetic layer, and the metal layer in a partial oxygen pressure,
    wherein the annealing temperature is 400° C. to 900° C. and wherein the partial oxygen pressure in the annealing is $10^{-10}$ bar to 1 bar, wherein, in the annealing, the magnetic layer is transformed to have an $L1_0$-crystalline structure by tensile stress applied in parallel with the surface of the magnetic layer by the metal layer which is transformed into a metal oxide, the c axis of the magnetic layer is aligned perpendicular to the direction in which the film plane of the magnetic layer is extended, and the metal layer is transformed into a metal oxide layer.

12. The method of claim 11, wherein only a surface of the metal layer is oxidized into the metal oxide layer and a part of the metal layer adjacent to the magnetic layer remains in a metal state without being oxidized.

13. The method of claim 11, further comprising:
    providing an insulating layer between the base layer and the magnetic layer,
    wherein, in the annealing, the insulating layer is annealed together with the base layer, the magnetic layer, and the metal layer.

14. The method of claim 13, further comprising:
    providing another magnetic layer between the insulating layer and the metal layer,
    wherein, in the annealing, the magnetic layer is annealed together with the base layer, the insulating layer, the magnetic layer, and the metal layer.

15. The method of claim 11, further comprising
reducing the thickness of the metal oxide layer after the annealing; and
providing an electrode layer on the metal oxide layer.

16. The method of claim 15, wherein the reducing of the thickness of the metal oxide layer partially removes the metal oxide layer by performing argon on milling, reactive ion etching, or chemical-mechanical planarization on the metal oxide layer.

17. A method of manufacturing a perpendicularly magnetized thin film structure, the method comprising:
forming a magnetic layer on a base layer such that the magnetic layer exhibits a magnetic easy direction in parallel to a surface between the magnetic layer and the base layer;
depositing a metal layer on the magnetic layer; and
annealing in a partial oxygen pressure the base layer, the magnetic layer, and the metal layer which oxidizes only a surface of the metal layer to form a metal oxide layer such that a part of the metal layer adjacent to the magnetic layer remains in a metal state without being oxidized and ensures perpendicular magnetic anisotropy of the magnetic layer as a result of oxidizing only a surface of the metal layer to form a metal oxide layer that transforms a phase of the magnetic layer into a $L1_0$-crystalline phase structure; and
wherein annealing is performed between 400° C. to 900° C. and the partial oxygen pressure in the annealing is between $10^{-10}$ bar to 1 bar,
wherein, as a result of annealing, the magnetic layer is transformed to have an $L1_0$-crystalline structure by tensile stress applied in parallel with the surface of the magnetic layer by the metal layer which is transformed into a metal oxide, the c axis of the magnetic layer is aligned perpendicular to the direction in which the film plane of the magnetic layer is extended, and the metal layer is transformed into a metal oxide layer.

18. The method of claim 17, further comprising:
providing an insulating layer located between the base layer and the magnetic layer; and
forming an electrode layer on the metal oxide layer.

19. The method of claim 18, wherein
the metal oxide layer is selected from a group of $TiO_2$, $Ta_2O_5$, $Al_2O_3$, $Cr_2O_3$, $ZrO_2$, $ZnO$, $Cu_2O$, and $NiO$;
the insulating layer includes an MgO layer and the thickness of the MgO layer is 2 nm or less; and
the magnetic layer contains a compound having a chemical formula of $A_{100-x}B_x$, the A is at least one element selected from a group of Fe(iron), Co(cobalt), Ni(nickel), Mn(manganese) or Cr(chromium), the B is at least one element selected from a group of Pt(platinum), Pd(palladium), Ni(nickel), Rh(rhodium), Au(gold), Hg(mercury) or Al(aluminum), and the x is 25 at % to 75 at %.

* * * * *